United States Patent [19]

Vesel

[11] 4,187,439
[45] Feb. 5, 1980

[54] ANALOG CONTROL OF PULSE RATES

[75] Inventor: Andrew M. Vesel, Mount Arlington, N.J.

[73] Assignee: The Cessna Aircraft Company, Wichita, Kans.

[21] Appl. No.: 879,522

[22] Filed: Feb. 21, 1978

Related U.S. Application Data

[60] Continuation of Ser. No. 748,341, Dec. 7, 1976, abandoned, which is a division of Ser. No. 561,466, Mar. 24, 1975, Pat. No. 4,014,025.

[51] Int. Cl.$^2$ .............................................. H03K 1/16
[52] U.S. Cl. .................................. 307/271; 307/273; 328/146; 328/150
[58] Field of Search ...................... 307/265, 271, 273; 328/39, 146, 150

[56] References Cited

U.S. PATENT DOCUMENTS

| | | | |
|---|---|---|---|
| 3,484,624 | 12/1969 | Rasiel et al. | 307/265 |
| 3,577,012 | 5/1971 | Dummermuth | 307/271 |
| 3,742,257 | 6/1973 | Wittenzellner | 307/273 |
| 3,883,756 | 5/1975 | Dragon | 307/273 |
| 3,968,447 | 7/1976 | Baylac et al. | 307/271 |

Primary Examiner—Stanley D. Miller, Jr.
Attorney, Agent, or Firm—Beveridge, De Grandi, Kline & Lunsford

[57] ABSTRACT

Apparatus for providing pulses at a rate limited by an input analog control signal. The analog control signal is compared to a ramp voltage, and an output pulse is generated when the ramp voltage reaches the control voltage level.

2 Claims, 4 Drawing Figures

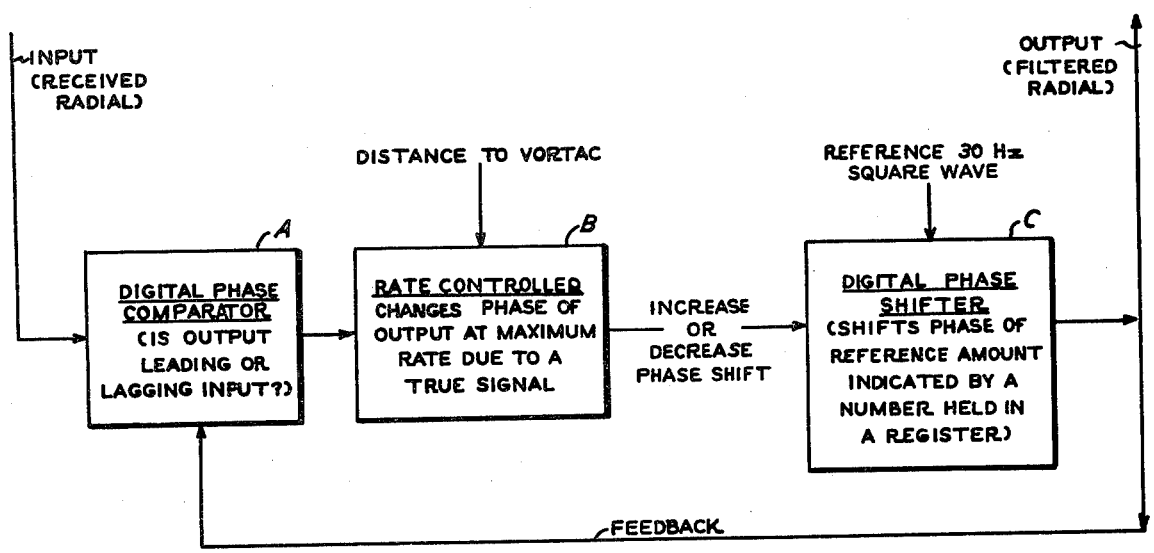
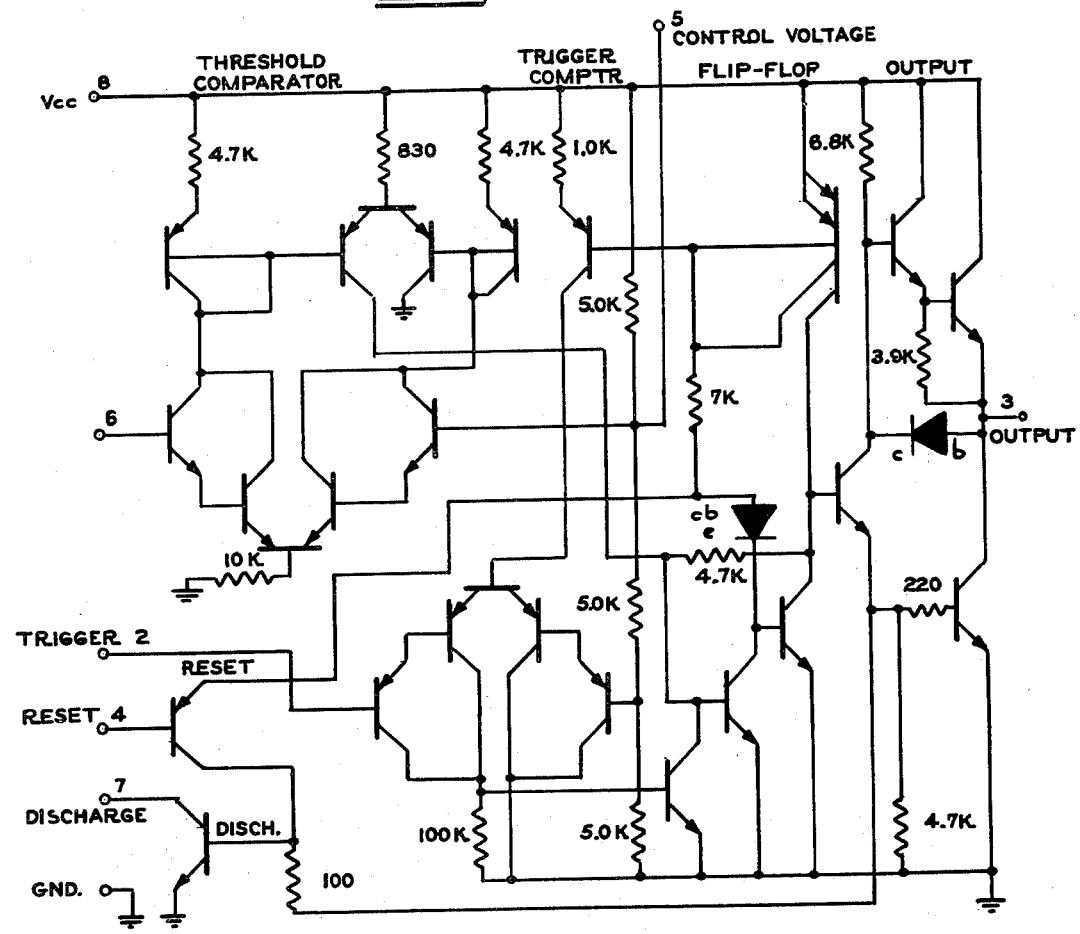

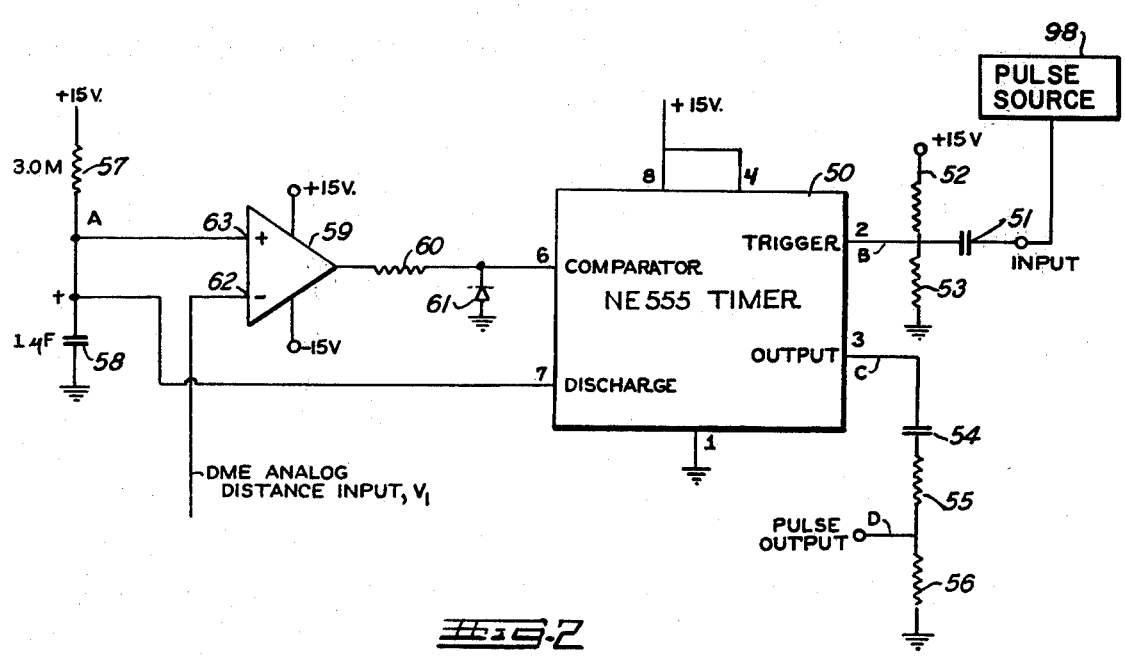

ANALOG CONTROL OF PULSE RATES

RELATED APPLICATIONS

The present application is a continuation of application Ser. No. 748,341 filed Dec. 7, 1976, now abandoned, which was a division of application Ser. No. 561,466, filed Mar. 24, 1975, now U.S. Pat. No. 4,014,025, dated Mar. 22, 1977.

BACKGROUND OF THE INVENTION

The present invention relates to an apparatus for generating pulses at a rate limited in accordance with an analog signal.

In particular, the pulse rate controller of the present invention has been found to be useful in scalloping suppression systems and methods such as disclosed in my above-identified U.S. Pat. No. 4,014,125, incorporated herein by reference.

The scalloping suppression system is used in a V.H.F. Omni Range (VOR) aircraft bearing system. A VOR system is sensitive to differences in phase of a received radial transmission, at typically 30 Hz., in relation to an omni directional transmission, also at 30 Hz. but out of phase with the radial transmission by an amount depending on bearing. The scalloping suppression system is arranged to respond to changes in phase which are due to position changes of the aircraft but not to respond to the generally more rapid changes in phase which are due to scalloping.

In the scalloping suppression system, a digital phase shifter-comparator network is employed to cause the phase of a reference signal to follow the phase of the received radial signal. The phase shifter includes two counters, and the phase comparator can include a bistable multivibrator. The output of the system is a delayed reference signal. An analog rate controller limits the rate at which the reference signal can follow the received radial signal. The limiting is made to be proportional to the distance between the aircraft and the VOR ground station so that the rate of change cannot exceed the phase change due to the velocity of the aircraft orthogonal to the received radial.

The analog rate controller inhibits pulses tending to change the reference signal stored in the phase shifter to an analog voltage level which is applied thereto, which voltage level is indicative of the distance between the aircraft and the ground station. The voltage level is applied to a comparator along with the voltage on a capacitor which is charged from a constant current source. When the capacitor voltage reaches the analog distance voltage, the comparator generates an output, and during the time that it takes the capacitor to charge to the distance voltage pulses tending to change the phase of the system output signal are inhibited.

SUMMARY OF THE INVENTION

The present invention provides a pulse rate controller for receiving input pulses and generating output pulses, with the output pulse rate limited by the amplitude of an analog control signal. In accordance with the present invention, input pulses are received on a first input line, and an analog control signal is received on a second input line. A voltage ramp generator applies a voltage ramp signal to a voltage comparison circuit which also receives the analog control signal. The comparison circuit assumes a first comparison condition when the analog control signal is of a greater voltage than the voltage ramp signal and a second comparison condition when the analog control signal is of a lesser voltage than the voltage ramp signal. A second circuit connected to the first input line, the voltage ramp generator, and the voltage comparison circuit is responsive to the voltage comparison circuit assuming its second comparison condition to assume a first state in which the second circuit discharges and disables the voltage ramp generator to prevent the generation of a voltage ramp signal and is responsive to an input pulse received on the first input line to assume a second state in which the second circuit enables the voltage ramp generator to generate a voltage ramp signal. A pulse source generates an output pulse in response to the second circuit assuming its second state. The voltage ramp generator may advantageously comprise a capacitor and a substantially constant current source for charging the capacitor.

BRIEF DESCRIPTION OF THE DRAWINGS

The invention will be better understood by referring to the accompanying drawings in which:

FIG. 1 is a simplified block diagram of a VOR bearing scalloping suppression system incorporating the pulse rate controller system of the invention.

FIG. 2 is a circuit diagram of the rate controller.

FIG. 3 is the circuit diagram of timer 50 of FIG. 2.

DETAILED DESCRIPTION

Figure 4:
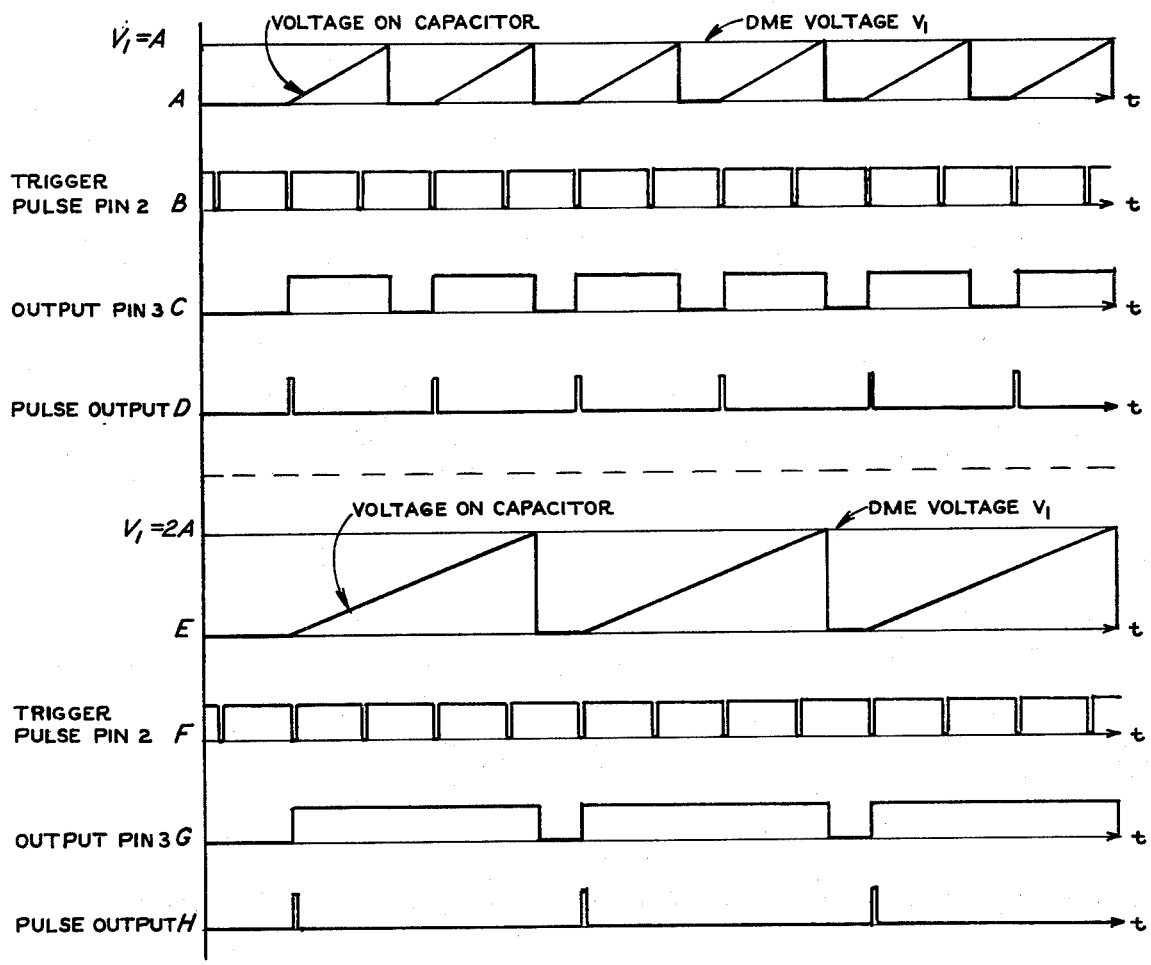
FIG. 4 is a waveform diagram useful in explaining the operation of the circuit of FIG. 2.

FIG. 1 is a simplified block diagram of a VOR scalloping suppression system employing the invention. The received 30 Hz sinusoidal reference wave is converted to a square wave, and the square wave is fed to digital phase shifter C which shifts the phase of the reference wave by an amount proportional to a number which is held in a digital register which is a part of the digital phase shifter. The output of digital phase shifter C is fed to a digital phase comparator A, as is a square wave which is derived from the variable 30 Hz received sinusoidal signal (denoted as the received radial in FIG. 1.) Phase comparator A determines whether the delayed reference wave leads or lags the variable phase wave and feeds a signal to digital phase shifter C to increase or decrease the stored number depending on whether the delayed reference leads or lags the variable phase signal. The increase or decrease signal is fed to phase shifter C through rate controller B which limits the rate of the increase or decrease adjustments in proportion to the distance from the aircraft to the VOR ground station which distance is applied to the controller as an analog voltage. Hence, the maximum rate at which the phase of the reference 30 Hz square wave can follow the phase of the variable 30 Hz square wave is limited to a value dependent on the aircraft to station distance which value is the maximum rate of change of phase due to actual changes in position of the aircraft. The output of digital phase shifter C is the output of the scalloping suppression system.

The rate controller B determines the rate at which the number which is held in digital phase shifter C may be changed. In the operation of the system the phase comparator generates pulses to increase or decrease the stored number at a 30 Hz rate. Hence the number may be adjusted 30 times each second but the rate controller limits the rate of adjustment by inhibiting a percentage of the phase comparator output pulses from being gated through to digital phase shifter C. In other words, if the proper pulse frequency at a distance of one mile is 30 Hz, then at a distance of 5 miles the rate controller passes only one out of every 5 pulses which results in a pulse frequency one-fifth that of the one mile rate or 6 Hz. At 100 miles the rate controller passes only one out of every one hundred pulses resulting in a 0.3 Hz rate. Since the number stored in the shifter C represents phase shift, the rate at which the number is changed is the rate at which the phase of the reference signal can follow the phase of the variable phase signal. The rate controller is set so that this rate is the maximum rate of change due to an actual position change of the aircraft as discussed above.

The present rate controller provides a divide-by-N function over a wide range of values that is controlled by an analog voltage. The rate controller can also be used as a wide-range speed controller for A.C. machinery or as a proportional controller for applying power to an A.C. load. If zero crossing pulses were generated every time the A.C. line crossed the 0 voltage, they could be applied to the rate controller and the output would be a pulse train having a frequency less than or equal to the line. Thus if the output of the rate controller were used to trigger a thyristor, the power would be applied to the load in proportion to the D.C. control voltage.

Referring to FIG. 2, the type 555 timer 50 is used as a monostable multivibrator. This timing circuit is commerically available as the Motorola MC1555 monolithic circuit or the Signetics NE555, and the schematic diagram thereof is shown in FIG. 3, pin 5 not being used in FIG. 2.

Referring to FIG. 2, capacitor 58 which may be a one $\mu f$ capacitor, is initially held discharged by a transistor within timer 50. When the timer is triggered by a negative-going pulse from pulse generator 98 applied to pin 2 through capacitor-resistor network 51, 52, 53, the short or discharge circuit across capacitor 58 is released, this capacitor begins to charge through resistor 57, and the output at pin 3 of the timer goes high. The charging of the capacitor is shown at line A of the waveform diagrams shown in FIG. 4, and the output at pin 3 is shown on line C. Reference voltage $V_1$ is applied to input 62 of comparator 59. Resistor 57 is chosen to be of an extremely high value, for instance three megohms, as shown in FIG. 2 so that the combination of the 15 volt voltage source and resistor 57 approximates a constant current source. If greater accuracy is required, an actual current source may be used. This causes capacitor 58 to charge approximately linearly, and at some time during its charging, the voltage across the capacitor, which is fed to input 63 of comparator 59, exceeds the reference voltage $V_1$ applied to input 62 of the comparator. This causes comparator 59 to emit an output signal which is applied to pin 6 of timer 50, causing the output of the timer at pin 3 to go low and the short circuit across capacitor 58 to be restored. Thus, it is seen at line C of FIG. 2 that the duration of the output at pin 3 is the time that it takes the capacitor to charge to the reference voltage value indicated as A on the Figure. The output at pin 3 is differentiated by capacitor 54 and its level is changed by resistors 55 and 56, resulting in the pulse output shown on line D of FIG. 4. During the time that the output at pin 3 is high, timer 50 cannot be retriggered by input pulses on pin 2, and since capacitor 58 charges approximately linearly the circuit produces only one output pulse for every two input pulses. Thus, it is seen in FIG. 4 that every other input pulse on line B is ignored. When the reference voltage is doubled to 2A, as illustrated on lines E, F, G and H of FIG. 4, it takes capacitor 58 twice as long to charge to the reference voltage level, and one output pulse is produced for every four input pulses. Thus, when the rate controller of FIG. 2 is utilized, it is seen how a percentage of the input pulses applied through capacitor 51 may be inhibited from reaching output D.

While a specific embodiment of the invention has been disclosed and described, the invention is not limited solely thereto, but rather the invention includes all embodiments which would be apparent to one skilled in the art and which come within the spirit and scope of the invention.

What is claimed is:

1. A pulse rate controller for receiving input pulses and generating output pulses with an output pulse rate limited by the amplitude of an analog control signal, said controller comprising:

first input means for receiving input pulses;

second input means for receiving an analog control signal;

a voltage ramp generator for generating a voltage ramp signal;

a voltage comparison circuit having a first input terminal connected to said second input means and a second input terminal connected to said voltage ramp generator and assuming a first comparison condition when the analog control signal is of a greater voltage than is the voltage ramp signal and a second comparison condition when the analog control signal is of a lesser voltage than is the voltage ramp signal;

circuit means connected to said first input means, to said voltage ramp generator, and to said voltage comparison circuit; said circuit means, in response to said voltage comparison circuit assuming said second comparison condition, assuming a first state in which said circuit means disables and discharges said voltage ramp generator to prevent generation of a voltage ramp signal; said circuit means in response to an input pulse received at said first input means assuming a second state in which said circuit means enables said voltage ramp generator to generate a voltage ramp signal; and pulse generating means connected to said circuit means for generating an output pulse in response to said circuit means assuming said second state.

2. The pulse rate controller of claim 1 wherein said voltage ramp generator comprises a capacitor and substantially constant current source means for charging said capacitor.

* * * * *